US012651726B2

(12) United States Patent
Zhang et al.

(10) Patent No.: US 12,651,726 B2
(45) Date of Patent: Jun. 9, 2026

(54) METHOD OF CONTROLLING PLASMA PROCESSING APPARATUS AND PLASMA PROCESSING APPARATUS

(71) Applicant: SEMES CO., LTD., Chungcheongnam-do (KR)

(72) Inventors: Aixian Zhang, Chungcheongnam-do (KR); Jung Hwan Lee, Chungcheongnam-do (KR); Min Keun Bae, Chungcheongnam-do (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 362 days.

(21) Appl. No.: 18/193,897

(22) Filed: Mar. 31, 2023

(65) Prior Publication Data

US 2024/0055229 A1      Feb. 15, 2024

(30) Foreign Application Priority Data

Aug. 10, 2022    (KR) ........................ 10-2022-0100116

(51) Int. Cl.
*H01J 37/32*          (2006.01)

(52) U.S. Cl.
CPC .. *H01J 37/32183* (2013.01); *H01J 37/32128* (2013.01); *H01J 37/32568* (2013.01); *H01J 37/32642* (2013.01); *H01J 2237/334* (2013.01)

(58) Field of Classification Search
CPC ........... H01J 37/32128; H01J 37/32568; H01J 37/32091; H01J 37/32642; H01J 37/32183
See application file for complete search history.

(56) References Cited

U.S. PATENT DOCUMENTS

| | | | |
|---|---|---|---|
| 2007/0169891 A1 | 7/2007 | Koshiishi et al. | |
| 2019/0122863 A1* | 4/2019 | Nagaseki .......... | H01J 37/32091 |
| 2019/0122903 A1 | 4/2019 | Shim et al. | |

(Continued)

FOREIGN PATENT DOCUMENTS

| | | |
|---|---|---|
| JP | 2005-277369 A | 10/2005 |
| KR | 10-2019-0046194 A | 5/2019 |

(Continued)

OTHER PUBLICATIONS

Babaeva, N. et al., "Penetration of plasma into the wafer focus ring gap in capacitively coupled plasmas" J. Appl. Phys. (Jun. 2007) pp. 113307-1-113307-11, vol. 101.

(Continued)

*Primary Examiner* — Joseph A Miller, Jr.

(74) *Attorney, Agent, or Firm* — Carter, DeLuca & Farrell LLP

(57)          ABSTRACT

The present disclosure relates to a method of controlling a plasma processing apparatus, and a plasma processing apparatus for performing the method. According to one embodiment of the present disclosure, a method of controlling a plasma processing apparatus includes supplying power having a sine wave from a high-frequency power source to a lower electrode to generate a plasma; and supplying power from the high-frequency power source to the lower electrode, to control an ion in the generated plasma, and when a voltage of a wafer disposed on the lower electrode has a negative peak value in a phase region, inputting a negative DC voltage to a focusing ring by a DC power source.

10 Claims, 18 Drawing Sheets

(56)     References Cited

U.S. PATENT DOCUMENTS

2020/0118794  A1*    4/2020   Koshimizu  .......  H01J 37/32027
2021/0407769  A1     12/2021  Kim et al.

FOREIGN PATENT DOCUMENTS

KR       10-2020-0040690  A       4/2020
KR       10-2021-0124143  A       10/2021
KR       10-2022-0000274  A       1/2022

OTHER PUBLICATIONS

Kiruthika, M. et al., "Characteristics of anodic glow pulsed plasma"
Phys. Lett. A (Oct. 2019) pp. 1-6.
Korean Office Action issued in corresponding KR Patent Applica-
tion No. 10-2022-0100116, dated Feb. 12, 2025, with English
translation.

* cited by examiner

METHOD OF CONTROLLING PLASMA PROCESSING APPARATUS AND PLASMA PROCESSING APPARATUS

CROSS-REFERENCE TO RELATED APPLICATION(S)

This application claims benefit of priority to Korean Patent Application No. 10-2022-0100116 filed on Aug. 10, 2022 in the Korean Intellectual Property Office, the disclosure of which is incorporated herein by reference in its entirety.

BACKGROUND

1. Field

The present disclosure relates to an etching apparatus, and, particularly, to a method of controlling a plasma processing apparatus and a plasma processing apparatus for performing the method.

2. Description of Related Art

In a conventional plasma processing apparatus, an etching process may be performed using plasma generated from gas by high-frequency power to form a fine hole or the like in a wafer. When the plasma is generated by applying a high-frequency power source to a processing container, a sheath region capable of accelerating an ion may be generated on a surface of the wafer. Since the sheath region in an outermost region of the wafer may not be uniform, an angle of incidence of the ion may be distorted. As a result, it is impossible to form a hole, perpendicular to the surface of the wafer.

Accordingly, Patent Document 1 discloses a plasma processing apparatus in which an inclined portion in which an outer circumferential side is located to be higher than an inner circumferential side is provided by an annular focusing ring on a circumferential portion of a wafer placed on a stage, to mitigate discontinuity of bias potential and improve uniformity of a surface to be processed.

However, it has been difficult to solve a problem of varying a thickness of a sheath region on the wafer due to plasma potential with only such a plasma processing apparatus, and a problem of entering plasma a gap C1 formed between an edge portion of the wafer and a focusing ring, to distort of the sheath region, could not be solved.

Specifically, when the thickness of the sheath region is changed to be thicker, a distance between the gap C1 and the plasma may increase such that an ion passes through the sheath region to acquire high kinetic energy, and ions in charge of etching with the high kinetic energy may be obliquely incident. On the other hand, when the thickness of the sheath region is thinner, an ion cannot be sufficiently accelerated. Accordingly, although an ion on the outer circumferential side of the wafer is obliquely incident from the edge portion of the wafer toward a central portion of the wafer at the gap C1, an effect of tilting the ion may not be outstanding.

That is, as a length of the sheath region is not constant and the thickness thereof repeatedly changes according to etching of the focusing ring, problems of continuously changing an ion tilting angle and an ion tilting effect, flowing between the focusing ring and the wafer, may be generated, and, as a result, a problem of generating a hole in the edge portion of the wafer with an elliptical shape may occur.

SUMMARY

In order to solve the conventional problems, a method of controlling a plasma processing apparatus for controlling a DC power source to input a negative DC voltage to a focusing ring, when potential of an electrode included in a stage reaches a negative peak, and the plasma processing apparatus, may be provided.

According to an aspect of the present disclosure, a method of controlling a plasma processing apparatus including a reaction chamber provided with a plasma treatment space; a stage disposed in the reaction chamber and including a lower electrode disposed in the reaction chamber to form plasma; an upper electrode disposed opposite to the lower electrode in the reaction chamber; a high-frequency power source connected to the stage and supplying two radio frequency (RF) power sources to the lower electrode; a focusing ring disposed around an edge region of a wafer disposed on the stage; and a DC power source connected to the focusing ring to supply a DC voltage, is provided, wherein the method includes supplying power having a sine wave from the high-frequency power source to the lower electrode to generate the plasma; and supplying power from the high-frequency power source to the lower electrode, to control an ion in the generated plasma, and when a voltage of the wafer disposed on the lower electrode has a negative peak value in a phase region, inputting a negative DC voltage to the focusing ring by the DC power source.

According to another aspect of the present disclosure, a computer recording medium recording a computer program for executing the method of any one of claims 1 to 10 on a computer is provided.

According to another aspect of the present disclosure, a plasma processing apparatus further includes a reaction chamber provided with a plasma treatment space; a stage disposed in the reaction chamber and including a lower electrode disposed in the reaction chamber to form plasma; an upper electrode disposed opposite to the lower electrode in the reaction chamber; a high-frequency power source connected to the stage and including an HF power source generating plasma and an LF power source controlling an ion in the plasma by supplying a radio frequency (RF) power source to the lower electrode; a focusing ring disposed around an edge region of a wafer; a DC power source connected to the focusing ring to supply a DC voltage; and a controller controlling voltage or current of the DC power source and voltage or current of the high-frequency power source, wherein, when power of the LF power source is supplied to the lower electrode and voltage of the wafer disposed on the lower electrode has a negative peak value in a phase region, the controller is configured to input a negative DC voltage to the focusing ring by the DC power source.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
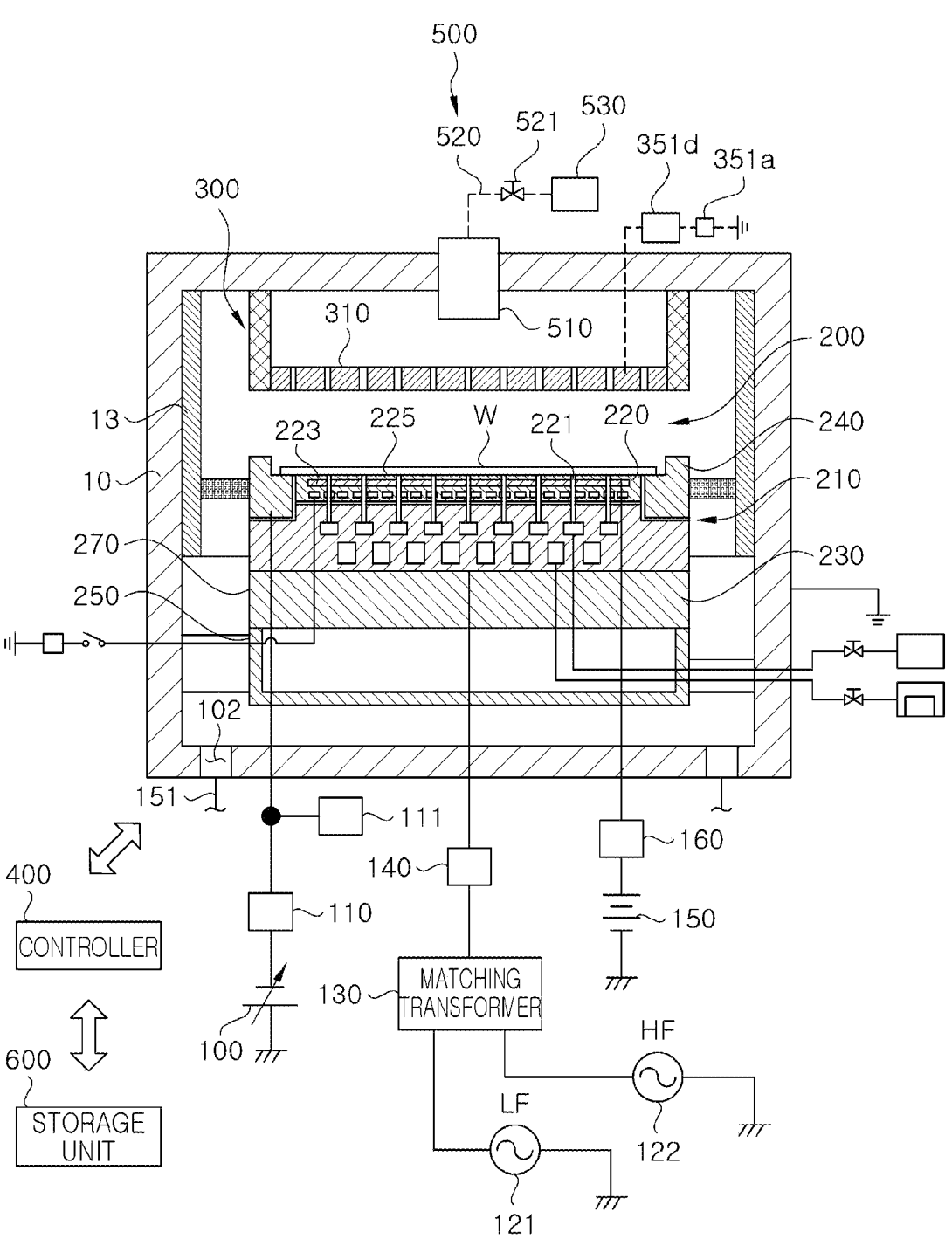
FIG. 1 is a configuration diagram illustrating a configuration of a plasma processing apparatus according to an embodiment of the present disclosure.

Hereinafter, preferred embodiments will be described in detail such that those skilled in the art may easily practice the present disclosure with reference to the accompanying drawings. However, in describing a preferred embodiment of the present disclosure in detail, if it may be determined that a detailed description of a related known function or configuration unnecessarily obscure the gist of the present disclosure, the detailed description will be omitted. In addition, the same reference numerals may be used throughout the drawings for a portion having a similar function and action. In addition, in this specification, terms such as 'on,' 'upper,' 'upper portion,' 'upper surface,' 'below,' 'lower,' 'lower portion,' 'lower surface', and 'side surface' may be based on the drawings, and may be actually vary depending on a direction in which an element or a component is placed.

In addition, throughout the specification, when a portion is said to be 'connected' to another portion, this may include not only a case in which it is 'directly connected,' but also a case in which it is 'indirectly connected' with another element in between. In addition, 'including' a certain component means that other components may be further included, rather than excluding other components, unless otherwise stated.

FIG. 1 is a configuration diagram illustrating a configuration of a plasma processing apparatus according to an embodiment of the present disclosure. A plasma processing apparatus according to an embodiment of the present disclosure may be a capacitively coupled plasma (CCP).

Referring to FIG. 1, a plasma processing apparatus according to an embodiment of the present disclosure may dry etch a wafer W using plasma. The plasma processing apparatus may include a reaction chamber 10, a substrate supporting assembly 200, a shower head unit 300, and a gas supply unit 500.

The reaction chamber 10 may provide a processing space in which a substrate processing process is performed in an internal space of the reaction chamber 10. The internal space of the reaction chamber 10 may have a closed shape. The reaction chamber 10 may be formed of metal, for example aluminum. Also, for process stability, the reaction chamber 10 may be grounded. An exhaust hole 102 may be formed on a bottom surface of the reaction chamber 10. The exhaust hole 102 may be connected to an exhaust line 151. A reaction by-product generated during the process and gas remaining in the internal space of the reaction chamber 10 may be discharged externally through the exhaust line 151. A pressure of the internal space of the reaction chamber 10 may be reduced to have a preset pressure by an exhausting process.

A liner 13 may be provided in the internal space of the reaction chamber 10. The liner 13 may have a cylindrical shape with exposed upper and down surfaces. The liner 13 may be provided to contact an inner side surface of the reaction chamber 10. The liner 13 may protect an inner side wall of the reaction chamber 10 from being damaged by arc discharge. In addition, it is possible to prevent impurities generated during the substrate processing process from being deposited on the inner side wall of the reaction chamber 10. Optionally, the liner 13 may not be provided.

The substrate supporting assembly 200 may be located in the internal space of the reaction chamber 10. The substrate supporting assembly 200 may support the wafer W. The substrate supporting assembly 200 may include a support unit 210 adsorbing the wafer W using electrostatic force. The substrate supporting assembly 200 may include the support unit 210, a lower cover 250, and a plate 270.

The support unit 210 for supporting the wafer W may be disposed in the reaction chamber 10. The support unit 210 may be an electrostatic chuck adsorbing the wafer W using electrostatic force. Specifically, a DC electrode 223 may be formed in the support unit 210. The DC electrode 223 may be electrically connected to a DC power source 150. Electrostatic force may be applied between the DC electrode 223 and the wafer W by DC current applied to the DC electrode 223, and the wafer W may be adsorbed to the support unit 210 by the electrostatic force.

For example, an electrostatic chuck for adsorbing and holding the wafer W with electrostatic force may be installed on an upper surface of a stage 230 to adsorb the wafer W, and a conductive focusing ring 240 containing, for example, silicon may be disposed around a circumference of the wafer W.

Specifically, the support unit 210 may include a dielectric plate 220, the stage 230, and the focusing ring 240. The support unit 210 may support the wafer W.

The dielectric plate 220 may be located on the support unit 210. The dielectric plate 220 may be provided as a dielectric substance having a disk-shape. The wafer W may be placed on an upper surface of the dielectric plate 220. The upper surface of the dielectric plate 220 may have a radius, shorter than a radius of the wafer W. An edge region of the wafer W may be located outside the dielectric plate 220.

The dielectric plate 220 may include the DC electrode 223, a heater 225, and a first supply passage 221 therein. The first supply passage 221 may be provided from an upper surface of the dielectric plate 210 to a lower surface of the dielectric plate 210. The first supply passage 221 may be provided as a plurality of first supply passages 221 spaced apart from each other, and may be provided as a passage through which a heat transfer medium is supplied to a lower surface of the wafer W.

The DC electrode 223 may be electrically connected to the DC power source 150. A switch may be installed between the DC electrode 223 and the DC power source 150. In this case, an RF filter 160 may be installed between the DC electrode 223 and the DC power source 150. This may be to block RF power source components generated by high-frequency power sources 121 and 122, for example, LF, HF, and harmonic components thereof from affecting the DC power source 150.

The stage 230 may include a metal plate. For example, the stage 230 may be entirely provided with the metal plate. The stage 230 may be electrically connected to the power sources 121 and 122 generating high-frequency and low frequency power. The power sources 121 and 122 may be provided as RF power sources, and may include an LF power source 121 and an HF power source 122, as illustrated in FIG. 1. A switch may be disposed between the stage 230 and the power sources 121 and 122. While the switch is turned on, the stage 230 may receive power from the power sources 121 and 122, and the stage 230 may serve as an electrode (e.g., a bias electrode). A matching transformer 130 may be disposed between the power sources 121 and 122 and the stage 230 (e.g., a bias electrode).

Among the shower head units 300, a shower head 310 may be electrically connected to a fourth power source 351a. The fourth power source 351a may be a high-frequency power source. The shower head 310 may be electrically connected to the fourth power source 351a or may be grounded, to function as an electrode (e.g., a source electrode). A second matching transformer 351d may be a circuit performing impedance matching to remove return loss of plasma power, and may be located between the shower head 310 (e.g., a source electrode) and the fourth power source 351a.

For example, an upper electrode may be installed above the stage 230 in parallel, to oppose the stage 230, and a space between a lower electrode installed on the stage 230 and the upper electrode of the shower head 310 may become a plasma processing space.

The gas supply unit 500 may supply process gas into the reaction chamber 10. The gas supply unit 500 may include a gas feeder 510, a gas supply pipe 520, and a gas storage unit 530. The gas feeder 510 may be installed in a central portion of an upper surface of the reaction chamber 10. The process gas may be supplied into the internal space of the reaction chamber 10 from the gas feeder 510.

A DC power source 100 may be electrically connected to the focusing ring 240, and a DC voltage may be applied from the DC power source 100. Control of the polarity and current/voltage of the DC voltage and DC current supplied from the DC power source 100, and control of turning on/off an electronic switch may be performed by a controller 400. In addition, an RF filter 110 may be connected between the DC power source 100 and the focusing ring 240, and a sensor unit 111 may be connected between the focusing ring 240 and the RF filter 110. This may be to block RF power source components generated by the power sources 121 and 122 through the RF filter 110, for example, LF, HF, and harmonic components thereof from affecting the DC power source 100, and to measure ion current flowing through the focusing ring 240 through the sensor unit 111.

The stage 230 may be connected to the high-frequency power sources 121 and 122 including the LF power source 121 and the HF power source 122 through a single matching transformer 130. The high-frequency power sources 121 and 122 may apply low frequency (LF) power to the stage 230 through the LF power source 121 such that an ion is drawn into the wafer W on the stage 230. In this case, the LF power source may not be constant, shaking may occur, and, when the ion is drawn, the ion may not be vertically incident in a certain direction.

The power sources 121 and 122 may apply high frequency (HF) power to the stage 230 through the HF power source 122. A frequency of the HF power may be several tens of MHz, preferably 13.56 MHz or higher, for example, 100 MHz. Alternatively, a frequency of the LF power supplied by the LF power source 121 may be several hundreds of KHz or several MHz, which is lower than the frequency of HF, preferably 400 kHz. A single matching transformer 130 may match internal impedance of the high-frequency power source with load impedance. A filter for passing a preset high frequency to a ground may be connected to the stage 230. In addition, the HF power supplied from the HF power source 122 among the high-frequency power sources may be applied to the upper electrode.

In this case, the single matching transformer 130 connected to the lower electrode provided on the stage 230 may dispose a sensor 140 therebetween. The sensor 140 may measure waveforms of voltage and current supplied from the high-frequency power source to the lower electrode provided on the stage 230.

The HF power from the HF power source 122 may be applied to the stage 230 in a state in which etching gas is introduced into the reaction chamber 10. In addition, the LF power from the LF power source 121 may be applied to the stage 230.

Processing gas discharged from a gas discharge hole of the upper electrode of the shower head 310 may be dissociated and ionized mainly by the HF power, to generate plasma. A surface of the wafer W to be processed may be etched by a radical or an ion in the plasma. In addition, the LF power may be applied to the stage 230, to control ions in the plasma, and to widen control margin of the plasma, such as etching of the hole with a high aspect ratio, or the like.

When etching is performed in the plasma processing apparatus having such a configuration, the wafer W to be etched may be first loaded into the reaction chamber 10, and may be placed on the stage 230. Then, the gas supply unit 500 may supply gas to the reaction chamber 10 through the upper electrode of the shower head 310. In addition, process gas in the reaction chamber 10 may be exhausted by an exhaust device. In this case, as the process gas, various conventionally used gases may be employed.

With the process gas introduced into the reaction chamber 10 in this manner, the HF power and the LF power may be applied to the stage 230 from the high-frequency power sources 121 and 122. In addition, a DC voltage may be applied from the DC power source 150 to the DC electrode 223, and the wafer W may be held on the stage 230. In addition, a negative voltage from the DC power source 100 may be applied to the focusing ring 240.

In this case, a controller 400 according to an embodiment of the present disclosure may repeatedly control a negative voltage output from the DC power source 100 by applying voltage and current to a specific phase region within light emission cycle of generated plasma, or each cycle of changes in sheath thickness of the plasma on the wafer W (the lower electrode) according to power supply paths of the high-frequency power sources 121 and 122, and by alternatingly turning on and off the negative voltage.

The power supply paths of the high-frequency power sources 121 and 122 may refer to the LF power source 121, the matching transformer 130, the sensor 140, the stage 230, the processing space in the reaction chamber 10, the upper electrode, and the ground. Voltage and current measured along the power supply paths of the high-frequency power sources 121 and 122 may include voltage and current measured in a partial path from the LF power source 121 to the stage 230 and by the upper electrode.

Further, the light emission cycle of the plasma and the cycle of changes in sheath thickness of the plasma on the wafer W may be used as indicators. The light emission cycle of the plasma may be detected by a photodiode, a photomicro sensor, or the like. Regarding the sheath thickness, the changes in sheath thickness may be measured by pressing a shutter at intervals of nanoseconds using an ICCD camera or the like.

Alternatively, parameters of the wafer W to be processed, including a type of the wafer W, a type of an etching process to be performed, potential corresponding to a degree of ion tilting, or the like, may be stored in a separate storage unit 600. Parameters pre-stored in the storage unit 600 may be used for control by the controller 400. The storage unit 600 may be a database provided separately for the present disclosure, or may be a main database in which process information for performing a process may be stored.

Also, the stage 230 may be an example of an electrode (a lower electrode) on which the wafer W is disposed. The upper electrode may be an example of an electrode opposing the lower electrode. The high-frequency power sources 121 and 122 may be an example of a bias power source supplying bias power to the lower electrode, and an example of a source power source supplying source power having a higher frequency than the bias power to the lower electrode or the upper electrode. The DC power source 100 may be an example of a DC power source suppling a DC voltage to the focusing ring 240. The source power source may correspond to a plasma generation source suppling plasma into the reaction chamber 10.

The controller 400 may be an example of a controller controlling a bias power source, a source power source, and a DC power source. Potential of the lower electrode (the stage 230) to which bias power is applied may be also referred to as electrode potential.

A controller 400 according to an embodiment of the present disclosure may control inputting of a negative DC voltage to the focusing ring 240 by the DC power source 140, when power of the high-frequency power source 121 is supplied and the lower electrode has a negative peak voltage in a phase region. For example, the controller 400 may control inputting for each specific phase region of each cycle.

In this case, the specific phase region may mean a region in which a phase of potential of the lower electrode is $3\pi/2$, and the $3\pi/2$ region may mean a region having a preset width based on a $3\pi/2$ phase of potential of the lower electrode.

For example, a plasma processing apparatus according to an embodiment of the present disclosure may include a reaction chamber 10 provided with a plasma processing space, a stage 230 disposed in the reaction chamber 10 and including a lower electrode disposed in the reaction chamber 10 to form plasma, an upper electrode disposed opposite to the lower electrode in the reaction chamber 10, power sources 121 and 122 connected to the stage 230 and including an HF power source 122 generating plasma and an LF power source 121 controlling ions in the plasma by supplying a radio frequency (RF) power source to the lower electrode, a focusing ring 240 disposed around an edge region of a wafer W, a DC power source 100 connected to the focusing ring 240 to supply a DC voltage, and a controller 400 controlling voltage or current of the DC power source 100 and voltage or current of the high-frequency power sources 121 and 122, wherein, when power of the LF power source 121 is supplied to the lower electrode and voltage of the wafer W disposed on the lower electrode has a negative peak value in a phase region, the controller 400 is configured to input a negative DC voltage to the focusing ring 240 by the DC power source 100.

Figure 4A:
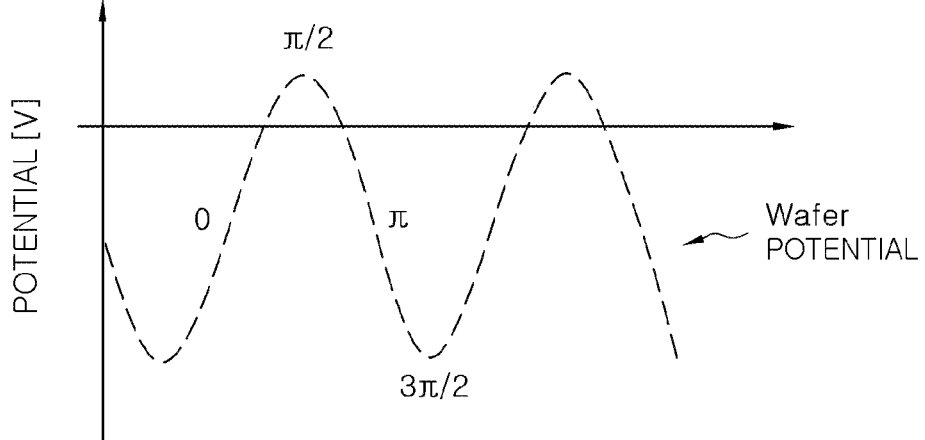
FIGS. 4A to 4D illustrate an ion tilt angle between a wafer and a focusing ring according to a phase of power supplied to an electrode in a conventional plasma processing apparatus.
Figure 4B:
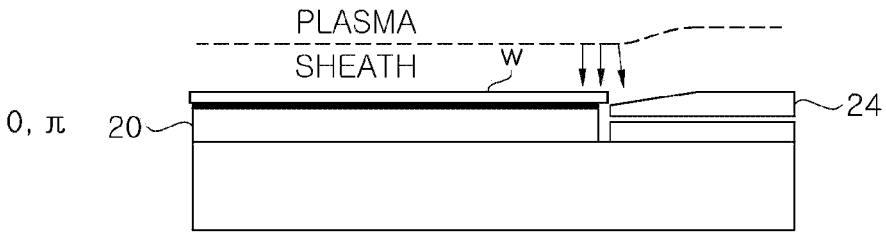
Figure 4C:
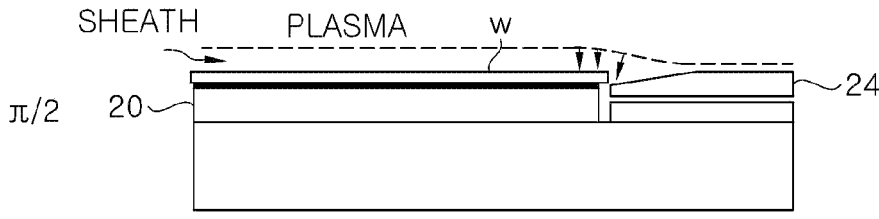
Figure 4D:
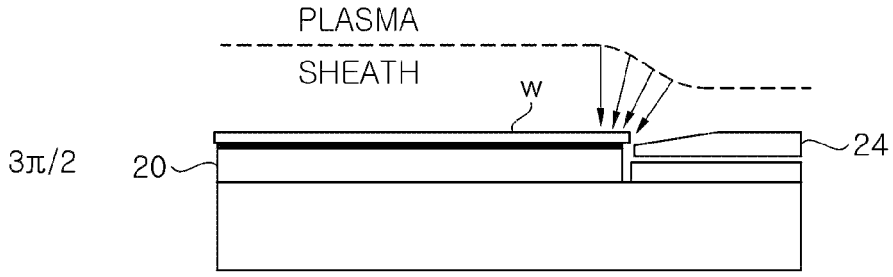
Figure 5:
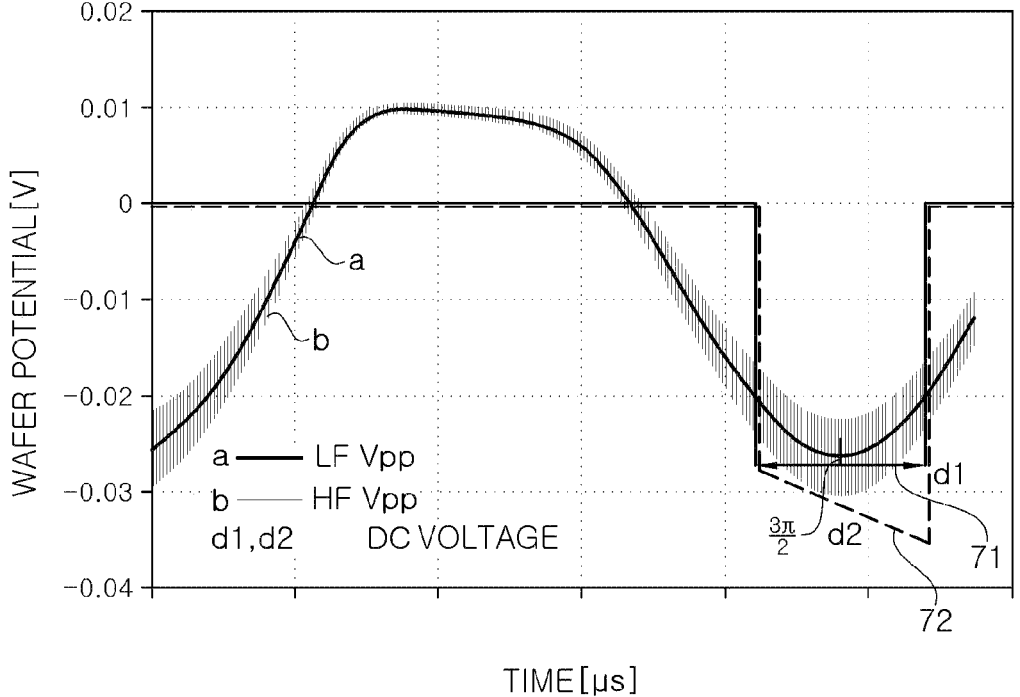
FIG. 5 illustrates a negative voltage applied according to a method of controlling a plasma processing apparatus according to an embodiment of the present disclosure.

Specifically, FIGS. 2 to 4 illustrate relationships between a wafer W and a focusing ring 240 when a method of controlling a plasma processing apparatus according to an embodiment of the present disclosure is not performed, and FIG. 5 illustrates a negative voltage applied according to a method of controlling a plasma processing apparatus according to an embodiment of the present disclosure, to solve this problem.

Figure 2A:
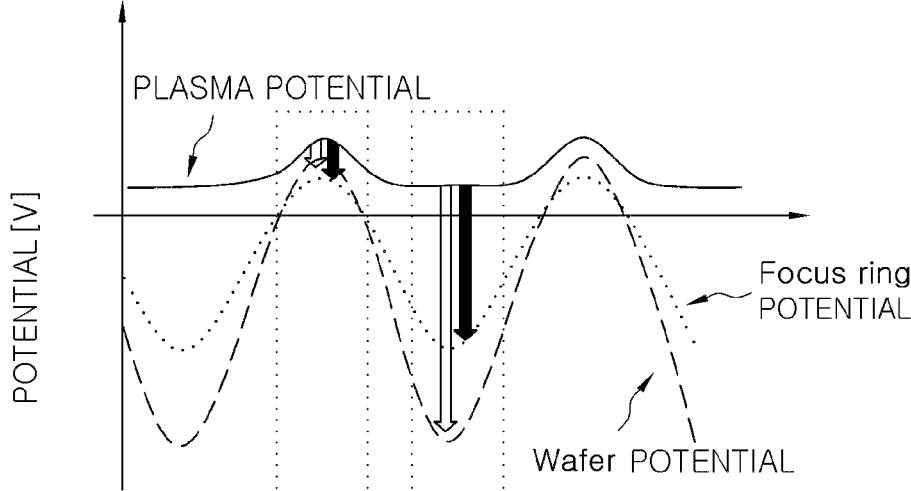
FIGS. 2A and 2B illustrate potential and ion energy distribution function (IEDF) of each configuration in a conventional plasma processing apparatus.
Figure 2B:
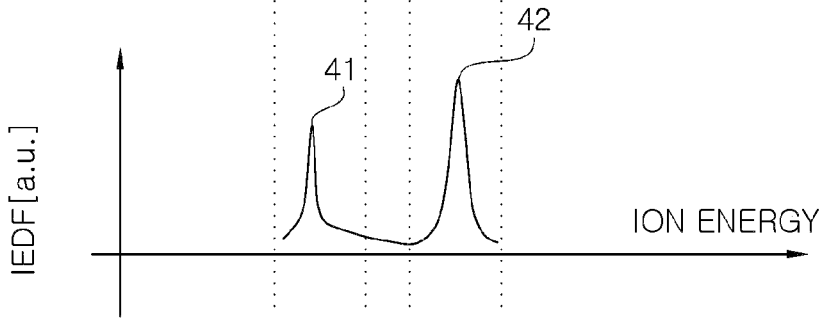

As illustrated in FIGS. 2A and 2B, when an HF power source 122 among high-frequency power sources is input to a wafer W through a lower electrode, plasma may be generated and plasma potential may be formed, as illustrated in FIG. 2A, and when an LF power source 121 among the high-frequency power source is input to the wafer W through the lower electrode, etching may be performed by controlling an ion in the plasma, and a difference between potential of the wafer W and potential of the focusing ring 240 may occur. The plasma potential may be slightly higher than the highest potential of the wafer, and the potential of the wafer W may be determined by the LF power source 121 having a lower frequency than the HF power source 122.

As illustrated in FIG. 2B, ions incident on the wafer W may be divided into first ion energy 41 and second ion energy 42 to form energy distribution in an ion energy distribution function (IEDF). The first ion energy 41 may be formed when wafer potential and focusing ring potential are the highest as positive voltages, and the second ion energy 42 may be formed when the wafer potential and the focusing ring potential are the highest as negative voltages. When an absolute potential value is large, the second ion energy 42 in which the wafer potential and the focusing ring potential are the largest as negative voltages may be acquired.

Specifically, the first ion energy 41 and the second ion energy 42 may be generated, as LF potential of the LF power source 121 is not constant and forms a waveform, and an ion incident on the wafer W in a region having the first ion energy 41 and an ion incident on the wafer W in a region having the second ion energy 42 may have ion energies responsible for etching. Ions in the region having the first ion energy 41 may weaken energies thereof as the ions pass through a sheath, and may thus be insufficient to proceed with the etching. Ions in the region having the second ion energy 42 may have sufficiently high energies even after passing through the sheath, to form trench holes vertically.

Figure 3A:
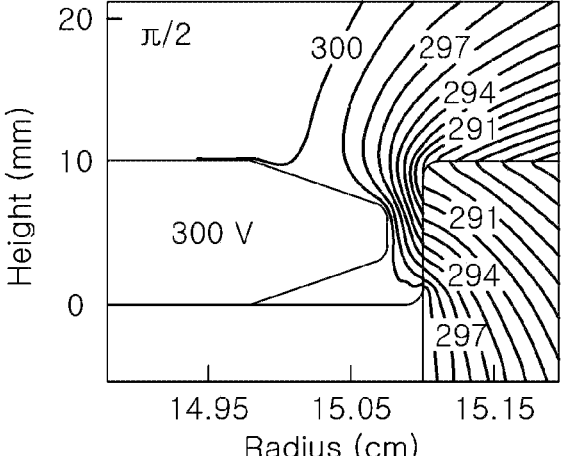
FIGS. 3A to 3C illustrate a potential difference between a wafer and a focusing ring according to a phase of power source supplied to an electrode in a conventional plasma processing apparatus.
Figure 3B:
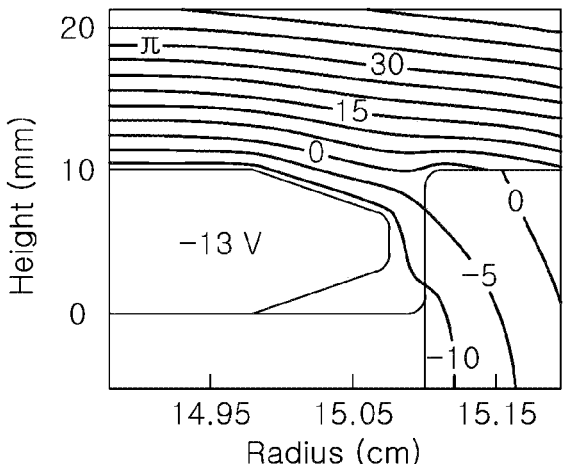
Figure 3C:
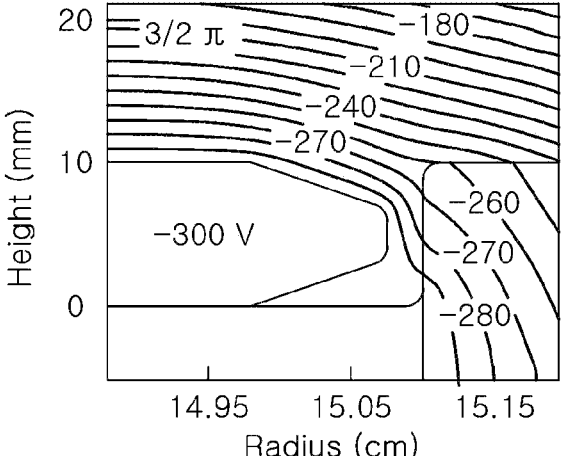

In particular, FIGS. 3A to 3C illustrate a potential difference between a wafer W and a focusing ring 240 for each phase within one RF cycle. When a phase of power source supplied from a LF power source 121 is $3\pi/2$, a potential difference between the wafer W and the focusing ring 240 may change more rapidly, compared to when the phase is $\pi/2$ and when the phase is $\pi$. When the phase of the power source supplied from the LF power source 121 is $\pi/2$ and $\pi$, a difference of around 10V may occur whether the potential is positive or negative on the same height. When the phase of the power source supplied from the LF power source 121 is $3\pi/2$, a potential difference of around 30 to 40 V may occur on the same height. Referring to FIGS. 3A to 3C, the wafer potential may be −300V and the focusing ring 240 potential may be −270V to −260V. In particular, in an upper portion of the wafer W and an upper portion of the focusing ring 240, when heights thereof are the same, a potential difference between the wafer potential and the focusing ring 240 may not be large and may change constantly, but a potential difference may be rapidly generated in a gap between the wafer W and the focusing ring 240.

As illustrated in FIGS. 4A to 4D, when a potential difference abruptly occurs in a gap between a wafer W and a focusing ring 240, a problem is that a thickness of a sheath may change non-uniformly.

First, it is assumed that potential of a power source supplied from an LF power source 121 is equal to potential of the wafer W.

As illustrated in FIG. 4A, when the potential of the wafer W is supplied as a sinusoidal wave, a phase of the potential may be divided into a case of π/2, a case of 0, π, and a case of 3π/2. Based on a plasma sheath length in the case of 0, π (FIG. 4B), a sheath length may be shorter in the case of π/2 (FIG. 4C), and a sheath length may be longer in the case of 3π/2 (FIG. 4D). As illustrated in FIG. 4C, when the sheath length is shortened, an angle of an ion incident on the gap between the wafer W and the focusing ring 240 may be bent. In this phase, a sheath length may be very high, such as several tens of micrometers, and a sheath voltage may be also very low, such as several tens of volts. Even though the ion bends and enters the wafer W, a kinetic energy may be as low as the first ion energy 41 in FIG. 2B. Therefore, in performing an etching process, it can be seen that an ion tilting effect is not large, compared to the ion having the second ion energy 42 in FIG. 2B.

As illustrated in FIG. 4D, when the sheath length increases, an angle of an ion incident on the gap between the wafer W and the focusing ring 240 may be greatly inclined. In this case, the sheath voltage may be hundreds of volts or several kilovolts, and a length thereof may be also equivalent to several millimeters. In this phase, while passing through the sheath, ions may acquire a considerably high kinetic energy, which corresponds to the second ion energy 42 in FIG. 2B. For example, since ions responsible for etching in an edge region of the wafer W are obliquely incident by the second ion energy 42, it may be difficult to maintain a high roundness of a hole and it may be difficult to form a deep and vertical trench.

For example, as a potential difference occurs between the wafer W and the focusing ring 240 for each phase, an incident angle and incident energy of an ion incident on the edge region of the wafer W may be changed.

Therefore, when the phase of the potential of the wafer W is 3π/2, as illustrated in FIG. 4D, to form vertically an angle of incidence of an ion on the edge of the wafer W while maintaining the sheath length constantly, it may be necessary to control the potential difference between the wafer W and the focusing rings 240 to be small.

To this end, as illustrated in FIG. 5, a method of controlling a plasma processing apparatus according to an embodiment of the present disclosure may include supplying power of high-frequency power sources 121 and 122 to a lower electrode to control an ion in generated plasma, and when voltage of a wafer W disposed on the lower electrode has a negative peak value in a phase region, inputting a negative DC voltage 71 or 72 to a focusing ring 240 by a DC power source 100. For example, the input may be controlled in a specific phase region of each cycle.

As a specific embodiment, the specific phase region may mean a region in which potential of the wafer W disposed on the lower electrode is 3π/2, and the 3π/2 region may mean a region based on a point in which a phase of the potential of the wafer W is 3π/2.

As illustrated in FIG. 5, the potential of the wafer W may be generated by the power supplied from the high-frequency power sources 121 and 122, and an amplitude of an LF voltage indicated by line a and an HF voltage indicated by line b may overlap each other, and may vibrate. In this case, a positive peak of the potential of the wafer W may be generated in a region in which the phase is π/2, and a negative peak of the potential of the wafer W may be generated in a region in which the phase is 3π/2. The DC voltage 71 or 72 may be input to the focusing ring 240 to reduce a potential difference between the wafer W and the focusing ring 240, to prevent an increase in tilting angle at which an ion having second ion energy 42 (see FIG. 2B) is incident due to a thickness of a sheath, when the potential of the wafer W has a negative peak.

Specifically, a magnitude of the DC voltage 71 supplied to the focusing ring 240 may be equal to a magnitude of the potential of the wafer W.

For example, in the inputting a negative DC voltage to a focusing ring 240 by a DC power source 100, the negative DC voltage having the same level as the negative voltage of the wafer W disposed on the lower electrode may be input to the focusing ring 240 for at least a certain period, and in FIG. 5, the DC voltage 71 representing the magnitude of the DC voltage and the certain period is illustrated.

As an embodiment, the DC voltage 71 should be input as much as the potential difference between the wafer W and the focusing ring 240. As the DC voltage 71 is supplied to the focusing ring 240, the DC voltage 71 may affect a plasma density. As above, the DC voltage 71 having the same magnitude as the potential of the wafer W may be substantially input, or the DC voltage 71 having the lower than the same magnitude as the potential of the wafer W may be substantially input.

In this case, periodically repeating a first voltage state in which the DC voltage 71 supplies a first voltage value and a second voltage state having at least one voltage value, lower than the first voltage value, and maintaining the second voltage state in a section in which potential of the wafer W disposed on the lower electrode becomes a negative peak according to supply of power sources of the high-frequency power sources 121 and 122, and maintaining the first voltage state in a different section, may be included.

In addition, according to an embodiment of the present disclosure, determining a time during which the DC voltage maintains a second state in a 3π/2 region of the potential of the wafer W disposed on the lower electrode according to a processing parameter of the wafer W, may be further included.

As illustrated in FIG. 5, the DC voltage 71 supplied to the focusing ring 240 may not only instantaneously occur in the 3π/2 region of the potential of the wafer W, may but also have a constant width by being maintained for a certain time, and may have a square shape such as the DC voltage 71 illustrated in FIG. 5. The DC voltage 71 may have the second voltage state, and a region in which the potential of the wafer W is 0 may have the first voltage state.

Therefore, when a cycle of the potential of the wafer W is repeated, the DC voltage 71 may also continuously repeat the first voltage state and the second voltage state.

In addition, the time for maintaining the second voltage state may be determined according to the processing parameter of the wafer W. For example, a degree of ion tilting of an edge region of the wafer W, expected according to a parameter of an etching process, such as a type of the wafer W, a type of gas to be injected, or the like, may be determined. A controller 400 according to an embodiment of the present disclosure may determine a magnitude of a voltage of the wafer W in the $3\pi/2$ region of the potential of the wafer W, and a time predicted or for maintaining a second state corresponding to a degree of ion tilting of stored in the storage unit 600, to supply a DC voltage (d1, 71), as illustrated in FIG. 5.

According to an embodiment of the present disclosure, in the inputting a negative DC voltage (d2, 72) to the focusing ring 240 by the DC power source 100, the negative DC voltage 72 may increase constantly a magnitude of an absolute value according to a voltage slope during the phase region, and a voltage may be zero in a region other than the phase region.

As illustrated in FIG. 5, in order for the DC voltage to be supplied to the focusing ring 240 to become the DC voltage (d1, 71), the DC voltage of the DC power source 100 supplied to the focusing ring 240 should be the DC voltage (d2, 72). This will be described later with reference to FIGS. 6 and 7.

Figure 6:
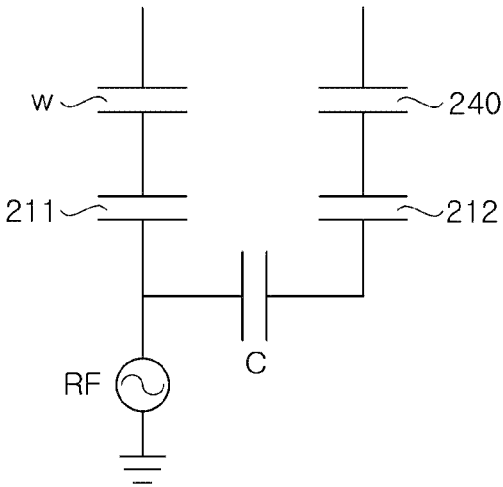
FIG. 6 illustrates a capacitance difference between a wafer and a support member thereof, and a capacitance difference between a focusing ring and a support member thereof.
Figure 7:
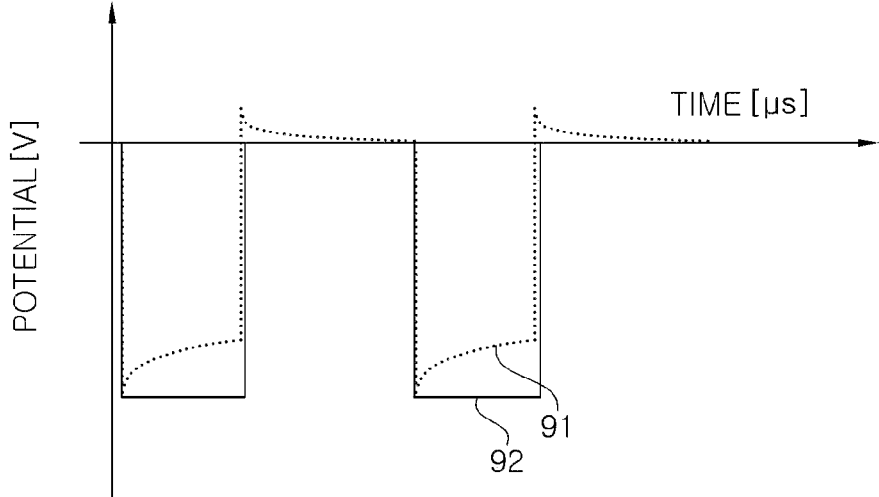
FIG. 7 illustrates an actual potential of a focusing ring, when the negative voltage according to FIG. 5 is not applied.

FIG. 6 is a simplified circuit diagram of a wafer W, a support member 211 thereof, a focusing ring 240, and a support member 212 thereof, and FIG. 7 illustrates an actual potential of a focusing ring 240, when the negative voltage (d2, 72) of FIG. 5 is not applied.

As illustrated in FIG. 6, a support unit 210 supporting a wafer W and a focusing ring 240 may include a wafer support member 211 supporting the wafer W and a focusing ring support member 212 supporting the focusing ring 240, the wafer W and the wafer support member 211 may be considered as capacitors connected in series, and the focusing ring 240 and the focusing ring support member 212 may be also the considered as capacitors connected in series. The wafer W and the focusing ring 240 may be connected to each other through the support unit 210, but a plurality of components may be disposed therebetween such that a coupling capacitor C may be provided between the wafer W and the wafer support member 211 and between the focusing ring 240 and the focusing ring support member 212, and as a result, power of high-frequency power sources 121 and 122 may be applied to the focusing ring 240 through the coupling capacitor. The wafer W, the wafer support member 211, the focusing ring 240, and the focusing ring support member 212 may have different areas, thicknesses, and materials, respectively, and capacitance of the focusing ring 240 and the focusing ring support member 212 may be lower than capacitance of the wafer W and the wafer support member 211.

For example, as a sheath boundary moves toward a plasma body in a $3\pi/2$ region of a phase of potential of a wafer having a long sheath length, more ions may enter the wafer W and the focusing ring 240. In this case, as the focusing ring 240 is charged more quickly, non-uniformity in potential between the wafer W and the focusing ring 240 may be caused.

For example, as illustrated in FIG. 7, when a constant negative DC voltage 92 is supplied from a DC power source 100 connected to a focusing ring 240, actual potential of the focusing ring 240 may have potential 91, as illustrated in FIG. 7, to reduce efficiency of achieving the original purpose. For example, when the DC power source 100 supplies the constant DC voltage 92, potential of the focusing ring 240 may gradually rise, as ions (current) charge the focusing ring 240 over time. As a result, the focusing ring 240 may have the non-uniform potential 91, as illustrated in FIG. 7.

Therefore, to reduce a non-uniform potential difference between potential of a wafer W and potential of the focusing ring 240, and to provide a constant DC voltage to the focusing ring 240, a DC voltage (d2, 72) having a voltage slope may be supplied, as illustrated in FIG. 5.

According to one embodiment of the present disclosure, to supply a DC voltage (d2, 72) having a voltage slope, measuring an ion current flowing in the focusing ring 240 through a sensor unit 111 connected to the focusing ring 240 by a lower support unit 210; acquiring capacitance of the focusing ring 240 calculated through focusing ring information including at least one of an area, a thickness, a structure, or a material of the focusing ring 240; and inputting a negative DC voltage having a voltage slope using the ion current and the capacitance and having a magnitude equal to or lower than a negative voltage of the voltage of the wafer W disposed on the lower electrode, to the focusing ring 240 for at least a certain section, may be included.

A calculated capacitance value may be stored in the storage unit 600, and the capacitance may be transmitted from the storage unit 600 to a controller 400, to calculate the voltage slope.

For example, a plasma processing apparatus according to an embodiment of the present disclosure may include a sensor unit 111 connected to the focusing ring 240 through a lower support unit 210 to measure an ion current flowing in the focusing ring 240; and a storage unit 600 storing a process parameter of the wafer W including capacitance of the focusing ring 240.

When a voltage of the wafer W disposed on the lower electrode is in a phase region having a negative voltage, the DC power source 100 may input a different negative DC voltage, depending on a magnitude of voltage of the wafer W disposed on the lower electrode, by the focusing ring 240.

Figure 8A:
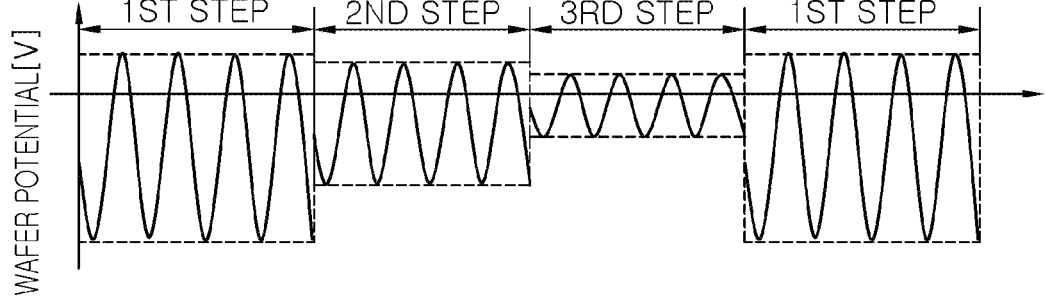
FIGS. 8A to 8C illustrates a voltage waveform applied to a focusing ring in which a method of controlling a plasma processing apparatus according to an embodiment of the present disclosure is performed when a plurality of pulsed potentials having different potential magnitudes are input to a wafer.
Figure 8B:
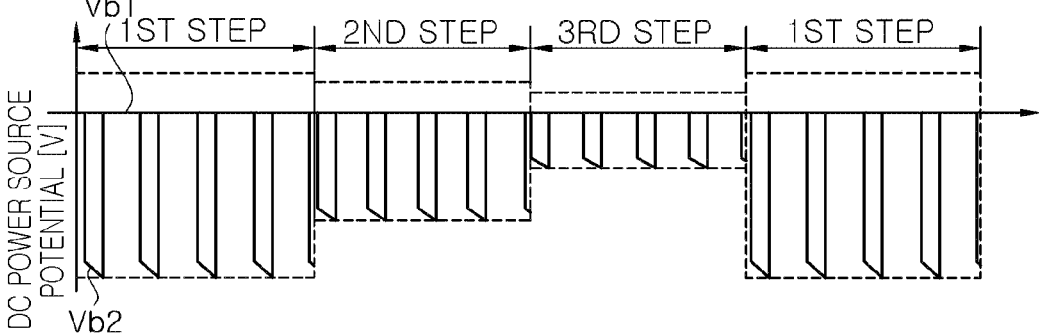
Figure 8C:
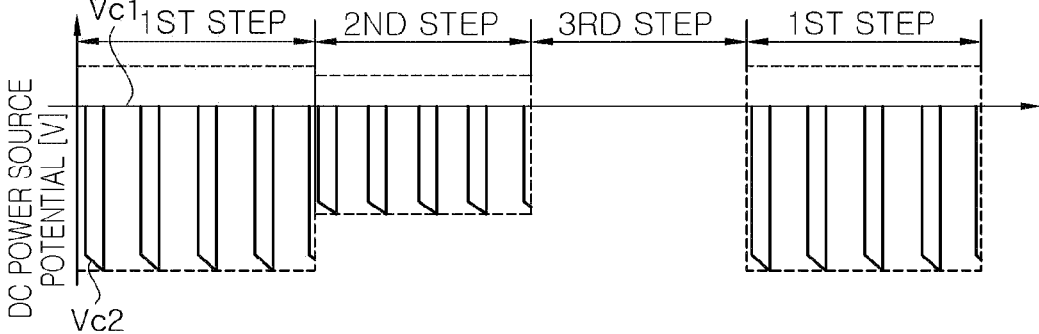

FIGS. 8A to 8C illustrate a voltage waveform applied to a focusing ring 240 in which a method of controlling a plasma processing apparatus according to an embodiment of the present disclosure is performed when a plurality of pulsed potentials having different potential magnitudes are input to a wafer.

As illustrated in FIG. 8A, when high-frequency power sources 121 and 122 supply pulsed power (a pulsed radio frequency) having different magnitude of voltage according to a duty cycle to a lower electrode, applying a preset minimum DC voltage during a duty cycle in which the pulsed power is supplied less than a preset magnitude may be included. The minimum DC voltage may be a value corresponding to when a DC power source 100 supplies power source having a certain threshold value or lower, as illustrated in FIG. 8B, or a value corresponding to when the DC power source 100 stops supplying power source, as illustrated in FIG. 8C.

Specifically, as illustrated in FIG. 8A, when the high-frequency power sources 121 and 122 supply the pulsed radio frequency to the potential of the wafer W, the potential of the wafer W may have a high state and a low state. It may not be divided into only two, as the high state and the low state, but may have different states for each step within a certain power range. For example, a first step having the highest potential, a second step having an intermediate potential, and a third step having the lowest potential may be repeated, and the steps are only illustrative, and the claims are not limited to the above values.

According to an embodiment of the present disclosure, a first voltage state in which a DC voltage applied to the focusing ring 240 supplies a first voltage value Vb1 and a second voltage state having at least one voltage value Vb2, lower than the first voltage value, may be periodically repeated, and the second voltage state may be maintained in a section in which potential of the wafer W disposed on the lower electrode becomes a negative peak according to supply of a power source of the high-frequency power source 121, and the first voltage state may be maintained in a different section.

Therefore, as illustrated in FIGS. 8B and 8C, the negative voltage Vb2 may be supplied in a 3π/2 phase region of the potential of the wafer, and Vb1 may be supplied in a different phase.

In the third step in which the potential of the wafer is the lowest may not be a step of supplying power for etching, but a step of supplying an RF power source to maintain plasma. Since the third step has very low ion energy, compared to other steps, a negative DC voltage may be separately supplied. Therefore, there is low need to separately control the ion energy.

Thus, on a constant offset wafer potential, such as in the third step, a DC voltage of zero may be applied or only a very small basic DC voltage may be provided. Contents overlapping the above will be omitted for brevity of description.

For example, according to an embodiment of the present disclosure, a single matching transformer 130 integrally connected to the LF power source 121 and the HF power source 122 of the high-frequency power sources 121 and 122, and a sensor 140 connected between the matching transformer 130 and the lower electrode and measuring voltage or current waveforms generated by the LF power source 121 and the HF power source 122, may be included. A controller 400 may acquire a magnitude of pulsed power supplied to the lower electrode by the LF power source 121 through the sensor 140, and may control the DC power source 100 to apply a preset minimum DC voltage, in a section in which the magnitude of the acquired power is supplied less than a preset magnitude, and the minimum DC voltage is a value corresponding to when the DC power source 100 stops supplying power source or when the DC power source 100 supplies power source having a certain threshold value or lower.

According to an embodiment of the present disclosure, when the focusing ring 240 is etched by an etching process, potential corresponding to a level difference between the focusing ring 240 and the wafer W may be additionally supplied. DC voltage compensation according to the etching of the focusing ring 240 may be determined as a value corresponding to a table value according to a process time, and the table value according to a process time may be stored in the storage unit 600. In this case, a voltage slope applied to the focusing ring 240 may be changed according to capacitance corresponding to the etched focusing ring 240 stored in the storage unit 600.

In addition, a controller 400 according to an embodiment of the present disclosure may include a signal generating circuit (not illustrated) generating a synchronization signal synchronizing a waveform of at least one of the LF power source 121, the HF power source 122, or the DC power source 100 with another waveform, and an oscilloscope (not illustrated) checking the waveform. It is possible to perform control such as receiving a portion of the power of the LF power source 121 to acquire a waveform, providing a DC voltage at the same timing corresponding to a synchronization signal or a specific phase region of the waveform, or the like.

Figure 9:
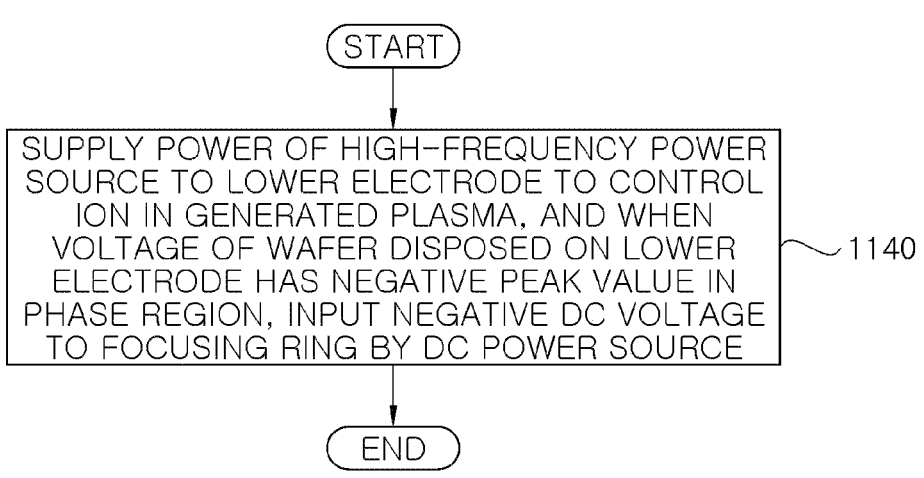
FIG. 9 is a flowchart of a method of controlling a plasma processing apparatus according to an embodiment of the present disclosure.
Figure 10:
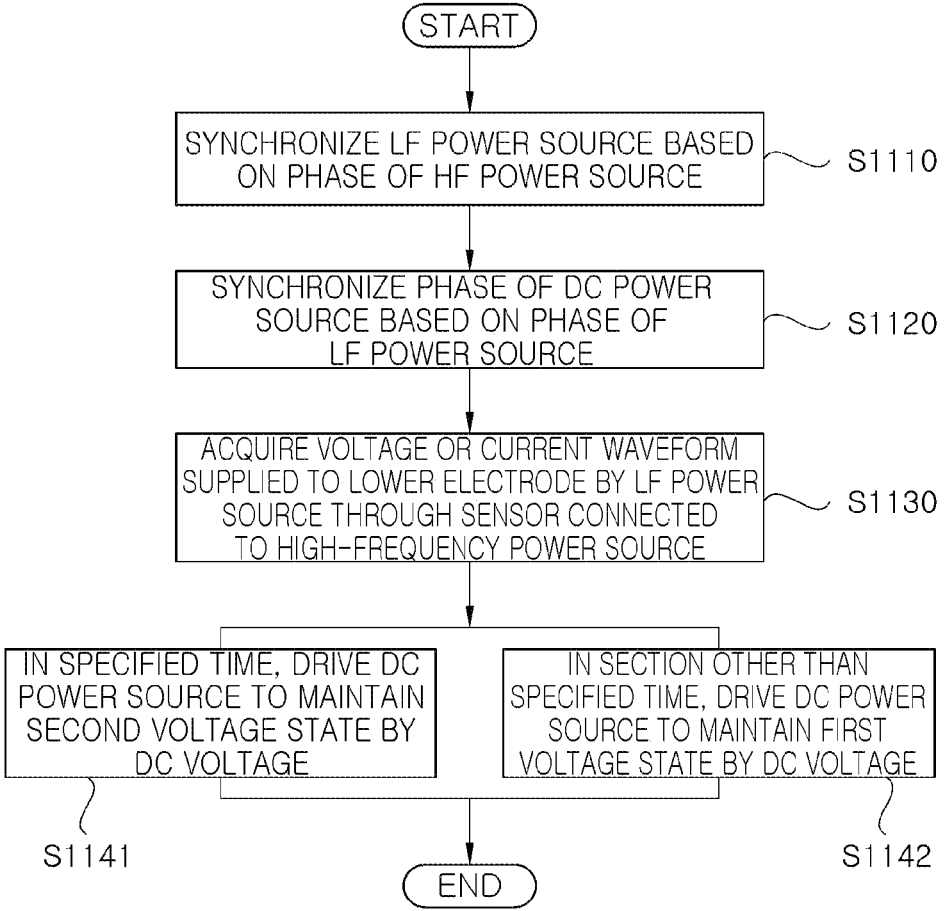
FIG. 10 is a flowchart of a method of controlling a plasma processing apparatus according to an embodiment of the present disclosure.

FIGS. 9 and 10 are flowchart of a method of controlling a plasma processing apparatus according to an embodiment of the present disclosure.

As illustrated in FIG. 9, according to an embodiment of the present disclosure, supplying power of high-frequency power sources 121 and 122 to a lower electrode to control an ion in generated plasma, and when voltage of a wafer W disposed on the lower electrode has a negative peak value in a phase region, inputting a negative DC voltage to a focusing ring 240 by a DC power source 100 may be performed (S1140).

The high-frequency power sources may include a high frequency (HF) power source 122 controlling a plasma density and a low frequency (LF) power source 121 that controls ion energy in the plasma.

As an embodiment, S1140 may be performed after supplying power having a sinusoidal wave from the HF power source 122 to the lower electrode to generate the plasma. In S1140, when a phase of the voltage of the wafer W formed by supplying power from the LF power source 121 of the high-frequency power source is a 3π/2 region, to control the ion in the plasma, a negative DC power source corresponding to a magnitude of the voltage of the wafer W may be supplied to the focusing ring 240. This may be a process for correcting the phase at one initial time, and when the phase correction is completed, the LF power source 121, the HF power source 122, and the DC power source 100 may be turned on/off at the same time.

Before the inputting a negative DC voltage to a focusing ring 240 by a DC power source 100, as illustrated in FIG. 10, such that potential of the wafer and potential of the focusing ring 240 are synchronized according to potential of the lower electrode, synchronizing the LF power source 121 based on a phase of the HF power source 122 (S1110); synchronizing a phase of the DC power source 100 based on a phase of the LF power source 121 (S1120); and acquiring a voltage or current waveform supplied to the lower electrode by the LF power source 121 through a sensor 140 connected to the high-frequency power sources 121 and 122 (S1130), may be further included.

Then, in an RF phase region, a specified time in S1140, driving the DC power source 100 to maintain a second voltage state having a second voltage value, a negative DC voltage (S1141), or in a section other than the specified time, driving the DC power source 100 to maintain the first voltage state by the DC voltage (S1142).

In this case, in S1142, when the voltage of the high-frequency power source is less than or equal to a preset voltage offset, the DC power source 100 may be stopped such that the DC voltage becomes 0.

Therefore, to keep a sheath length constant and drill a hole having a high aspect ratio at an outer edge of the wafer, a DC voltage is necessary to be applied in a position in which the sheath length varies greatly depending on an LF voltage, and turning on-off and slope of the DC voltage is necessary to be adjusted.

In addition, the present disclosure may provide a computer recording medium storing a computer program for performing the above-described method on a computer.

The above-described method of controlling a plasma processing apparatus according to an embodiment of the present disclosure may be produced as a program to be executed on the computer, and may be stored in a computer-readable recording medium. Examples of the computer-readable recording medium may include a ROM, a RAM, a CD-ROM, a magnetic tape, a floppy disk, an optical data storage device, and the like. In addition, the computer-readable recording medium may be distributed to a computer system connected through a network, such that a computer-readable code may be stored and executed in a distributed manner. In addition, a functional program, a code, and a code segment for implementing the method may be easily inferred by a programmer skilled in the art to which the present disclosure belongs.

In addition, in describing the present disclosure, '~unit' or '~portion' may be implemented in various ways, for example, by a processor, program instructions executed by the processor, a software module, a microcode, a computer program product, a logic circuit, an application-specific integrated circuit, firmware, or the like.

The contents of methods disclosed in embodiments of the present application may be directly implemented by a hardware processor, or may be implemented and completed by a combination of hardware and software modules among processors. The software module may be stored in conventional storage media such as a random access memory, a flash memory, a read only memory, a programmable read only memory or an electrically erasable programmable memory, a register, or the like. The storage medium may be located in a memory, and the processor may read information stored in the memory, and may combine with the hardware to complete the content of the above methods. To avoid duplication, detailed descriptions will be omitted herein.

According to an embodiment of the present disclosure, when a circular hole is formed at an outer edge of a wafer, ion tilting may be reduced, an aspect ratio may be increased, and a length of a sheath at a boundary between the wafer and a focusing ring may be kept constant.

While example embodiments have been illustrated and described above, it will be apparent to those skilled in the art that modifications and variations could be made without departing from the scope of the present disclosure as defined by the appended claims.

What is claimed is:

1. A method of controlling a plasma processing apparatus including a reaction chamber provided with a plasma treatment space; a support unit including a stage disposed in the reaction chamber and configured to support a wafer; the wafer; a lower electrode disposed below the wafer in the reaction chamber to form plasma; an upper electrode disposed above the wafer and opposite to the lower electrode in the reaction chamber; a power source connected to the support unit and including a high frequency (HF) power source configured to generate plasma and a low frequency (LF) power source configured to control ions in the plasma; a focusing ring disposed around an edge region of the wafer; and a DC power source connected to the focusing ring to supply a DC voltage, wherein the method comprises:

supplying power having a sine wave from the HF power source to the lower electrode to generate the plasma;

supplying power from the LF power source to the lower electrode, to control the ions in the generated plasma, and when a voltage of the wafer has a negative peak value in a phase region, a controller is configured to input a negative DC voltage to the focusing ring by the DC power source;

measuring an ion current flowing in the focusing ring through a sensor unit connected to the focusing ring by a lower support unit;

acquiring capacitance of the focusing ring calculated through focusing ring information including at least one of an area, a thickness, a structure, or a material of the focusing ring; and inputting a negative DC voltage using the ion current and the capacitance and having a magnitude equal to or lower than a negative voltage of the voltage of the wafer disposed on the lower electrode, to the focusing ring, wherein, in the inputting the negative DC voltage to the focusing ring by the DC power source, a negative DC voltage having a magnitude equal to or lower than a negative voltage of the voltage of the wafer is input to the focusing ring.

2. The method of claim 1, further comprising:

periodically repeating a first voltage state in which the DC voltage supplies a first voltage value and a second voltage state having at least one voltage value, lower than the first voltage value; and maintaining the second voltage state in a section in which potential of the wafer becomes a negative peak according to supply of a power source of the HF power source, and maintaining the first voltage state in a different section.

3. The method of claim 1, wherein the phase region is a region in which potential of the wafer disposed on the lower electrode is $3\pi/2$.

4. The method of claim 3, further comprising determining a time during which the DC voltage maintains a second state in a $3\pi/2$ region of the potential of the wafer according to a type of the wafer, a type of an etching process to be performed, a type of gas to be injected, and potential corresponding to a degree of ion tilting of an edge region of the wafer.

5. The method of claim 1, further comprising, when the HF and LF power sources supply pulsed power having different magnitudes of voltage according to a duty cycle to the lower electrode, applying a preset minimum DC voltage during a duty cycle in which the pulsed power is supplied less than a preset magnitude.

6. The method of claim 5, wherein the minimum DC voltage is a value corresponding to when the DC power source stops supplying a power source or when the DC power source supplies a power source having a certain threshold value or lower.

7. The method of claim 1, wherein, in the inputting a negative DC voltage to the focusing ring by the DC power source, a magnitude of an absolute value of the negative DC voltage increases constantly, and the negative DC voltage is 0 outside the phase region.

8. The method of claim 1, wherein the power source comprises a high frequency (HF) power source generating plasma and a low frequency (LF) power source controlling ion energy of the plasma, and the method further comprises, before the inputting a negative DC voltage to the focusing ring by the DC power source:

synchronizing the LF power source based on a phase of the HF power source;

synchronizing a phase of the DC power source based on a phase of the LF power source; and acquiring a voltage or current waveform supplied to the lower electrode by the LF power source through a sensor connected to the power source.

9. The method of claim 1, wherein, when the focusing ring is etched by an etching process, potential corresponding to a step difference between the focusing ring and the wafer is additionally supplied.

10. A computer recording medium recording a computer program for executing the method of claim 1 on a computer.

\* \* \* \* \*